(12) United States Patent
Johnson

(10) Patent No.: US 7,161,167 B2
(45) Date of Patent: Jan. 9, 2007

(54) LATERAL PHASE CHANGE MEMORY

(75) Inventor: Brian G. Johnson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 158 days.

(21) Appl. No.: 10/633,874

(22) Filed: Aug. 4, 2003

(65) Prior Publication Data

US 2005/0029503 A1 Feb. 10, 2005

(51) Int. Cl.
*H01L 47/00* (2006.01)
(52) U.S. Cl. .......................................... 257/5; 365/105
(58) Field of Classification Search .................... 257/2, 257/3–5, 42, 53, 536, 537, 614, 529; 438/102, 438/103, 900, 30; 365/105
See application file for complete search history.

(56) References Cited

U.S. PATENT DOCUMENTS

| | | | | |
|---|---|---|---|---|
| 3,820,150 A * | 6/1974 | Nicolaides | .................. | 257/4 |
| 4,203,123 A * | 5/1980 | Shanks | .......................... | 257/2 |
| 5,166,758 A | 11/1992 | Ovshinsky et al. | ............. | 257/3 |
| 5,914,893 A * | 6/1999 | Kozicki et al. | ............. | 365/107 |
| 5,933,365 A * | 8/1999 | Klersy et al. | ................ | 365/148 |
| 6,189,582 B1 * | 2/2001 | Reinberg et al. | ............. | 438/239 |
| 6,225,142 B1 * | 5/2001 | Reinberg | ..................... | 438/95 |
| 6,316,784 B1 * | 11/2001 | Zahorik et al. | ................. | 257/3 |
| 6,605,821 B1 * | 8/2003 | Lee et al. | ....................... | 257/2 |
| 6,867,425 B1 * | 3/2005 | Wicker | ........................... | 257/3 |
| 2004/0178403 A1 * | 9/2004 | Ovshinsky | ...................... | 257/4 |
| 2004/0245603 A1 * | 12/2004 | Lowrey et al. | ............. | 257/536 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.
Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.
Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

(Continued)

Primary Examiner—Thomas L. Dickey
(74) Attorney, Agent, or Firm—Trop, Pruner & Hu, P.C.

(57) ABSTRACT

A lateral phase change cell may be formed over a semiconductor substrate. The lateral cell, in some embodiments, may be exposed to light so that the same cell may be addressed by both optical and electrical signals.

9 Claims, 7 Drawing Sheets

OTHER PUBLICATIONS

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

Wicker, G.C., "Phase Change Memory and Method Therefor", U.S. Appl. No. 10/318,984, filed Dec. 13, 2002.

Wicker, G.C., "Lateral Phase Change Memory and Method Therefor", U.S. Appl. No. 10/319,204, filed Dec. 13, 2002.

* cited by examiner

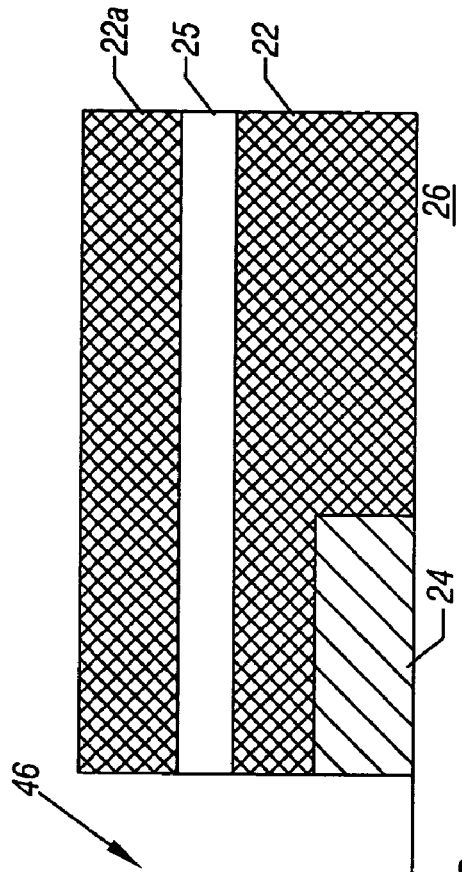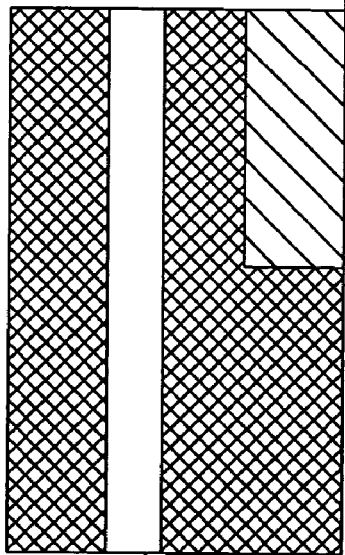
FIG. 2
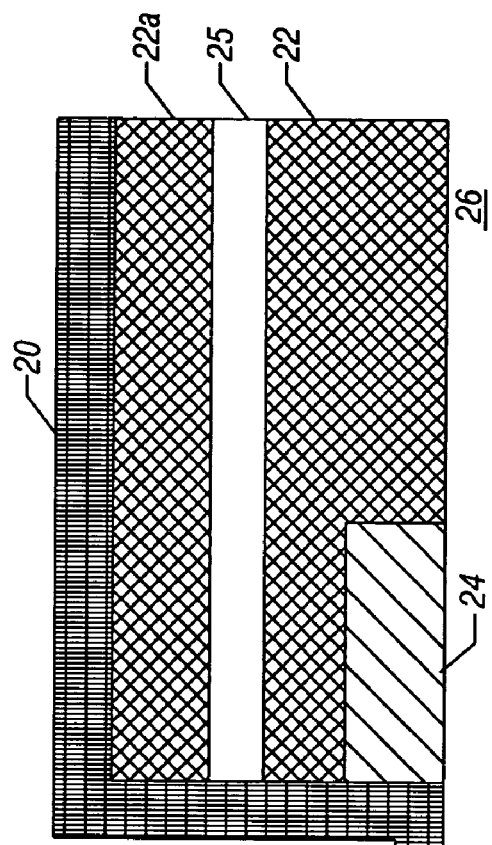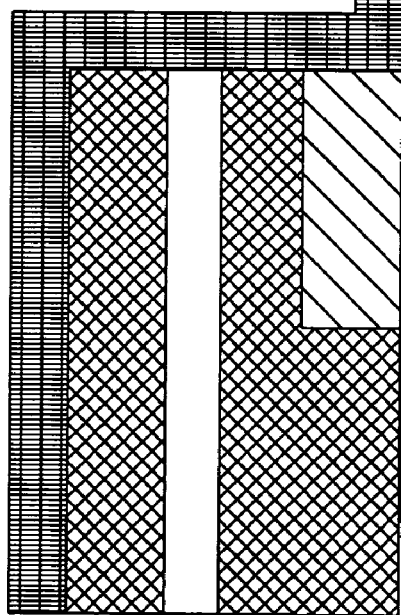
FIG. 3

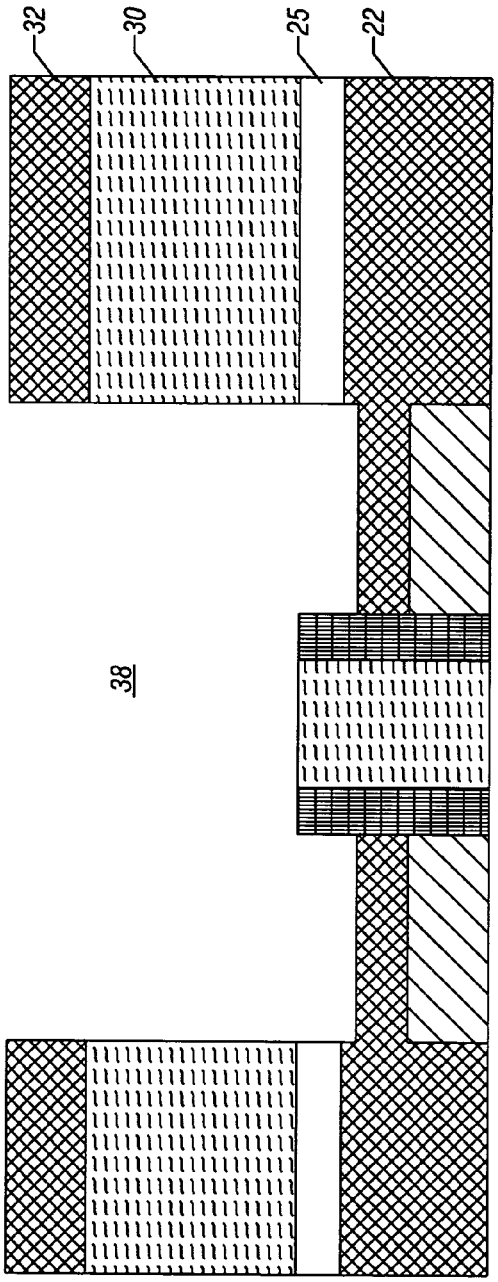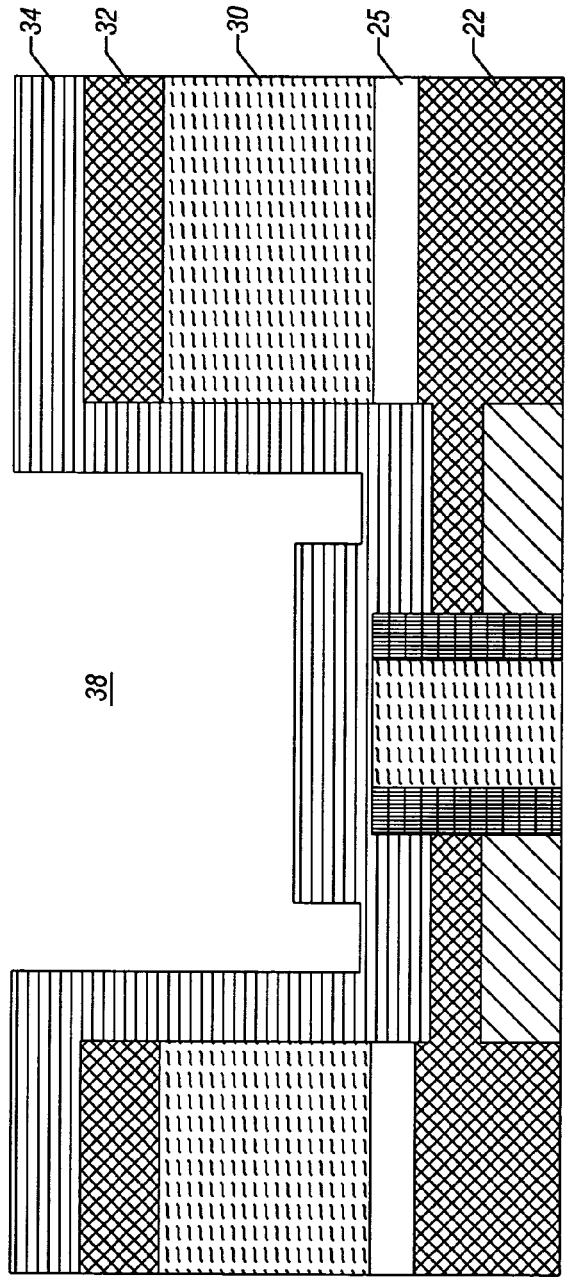

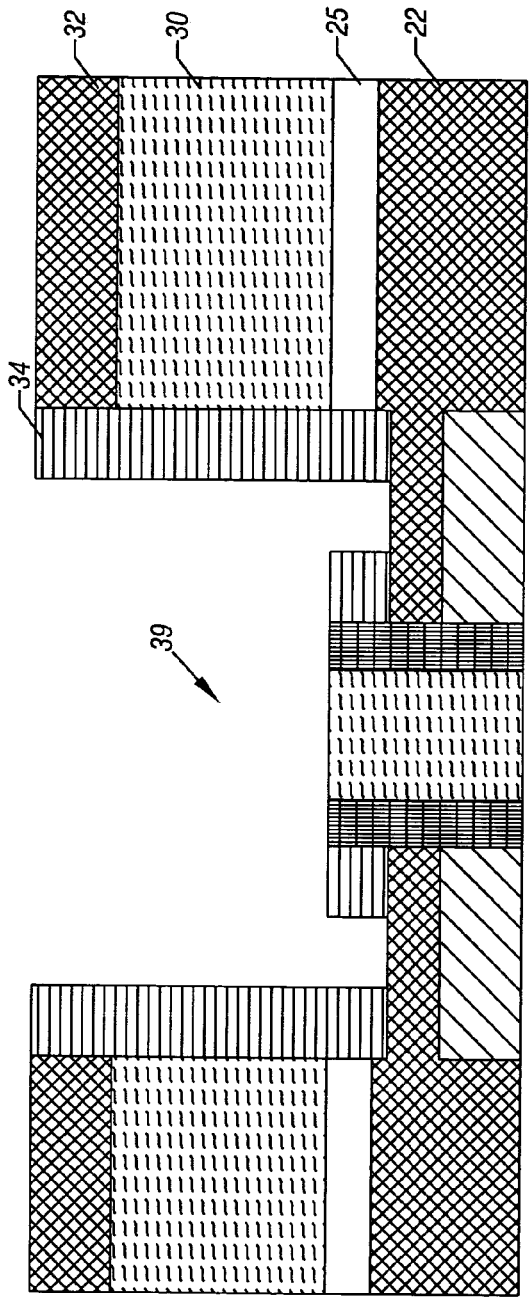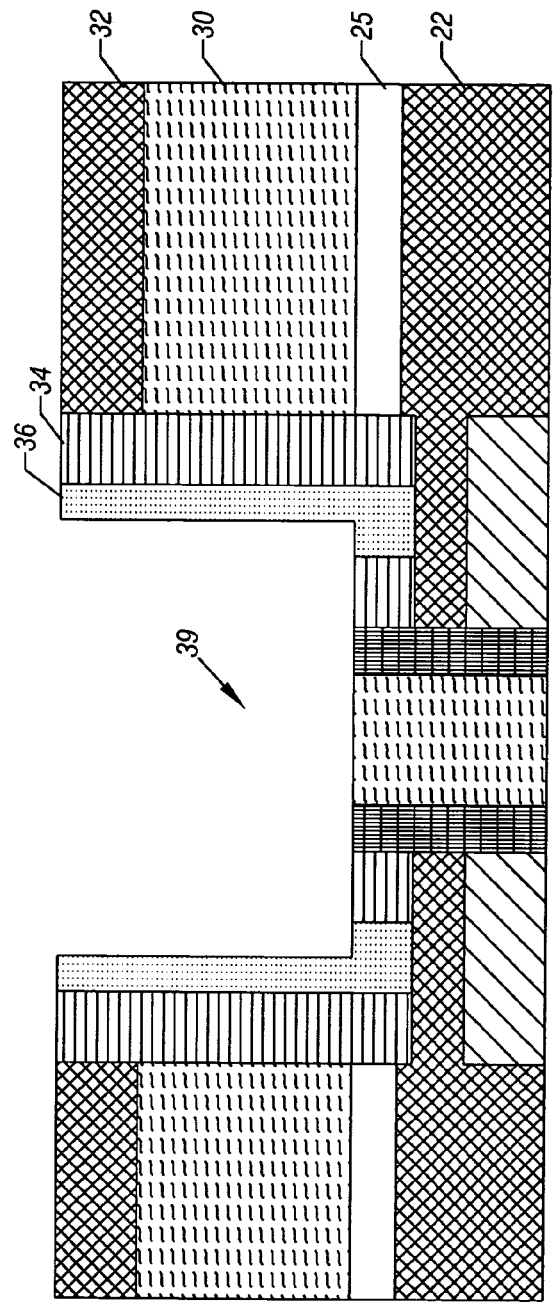

LATERAL PHASE CHANGE MEMORY

BACKGROUND

This invention relates generally to phase change memories.

Phase change memories use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the material (e.g., crystalline or amorphous).

Thus, there is a need for different ways to make phase change memories.

BRIEF DESCRIPTION OF THE DRAWINGS

FIG. 2 is a greatly enlarged cross-sectional view at an early stage of manufacture in accordance with one embodiment of the present invention;

FIG. 3 is a greatly enlarged cross-sectional view at a subsequent stage of manufacture in accordance with one embodiment of the present invention;

FIG. 6 is a greatly enlarged cross-sectional view at a subsequent stage of manufacture in accordance with one embodiment of the present invention;

FIG. 7 is a greatly enlarged cross-sectional view at a subsequent stage of manufacture in accordance with one embodiment of the present invention;

FIG. 8 is a greatly enlarged cross-sectional view at a subsequent stage of manufacture in accordance with one embodiment of the present invention;

FIG. 9 is a greatly enlarged cross-sectional view at a subsequent stage of manufacture in accordance with one embodiment of the present invention;

DETAILED DESCRIPTION

Figure 1:
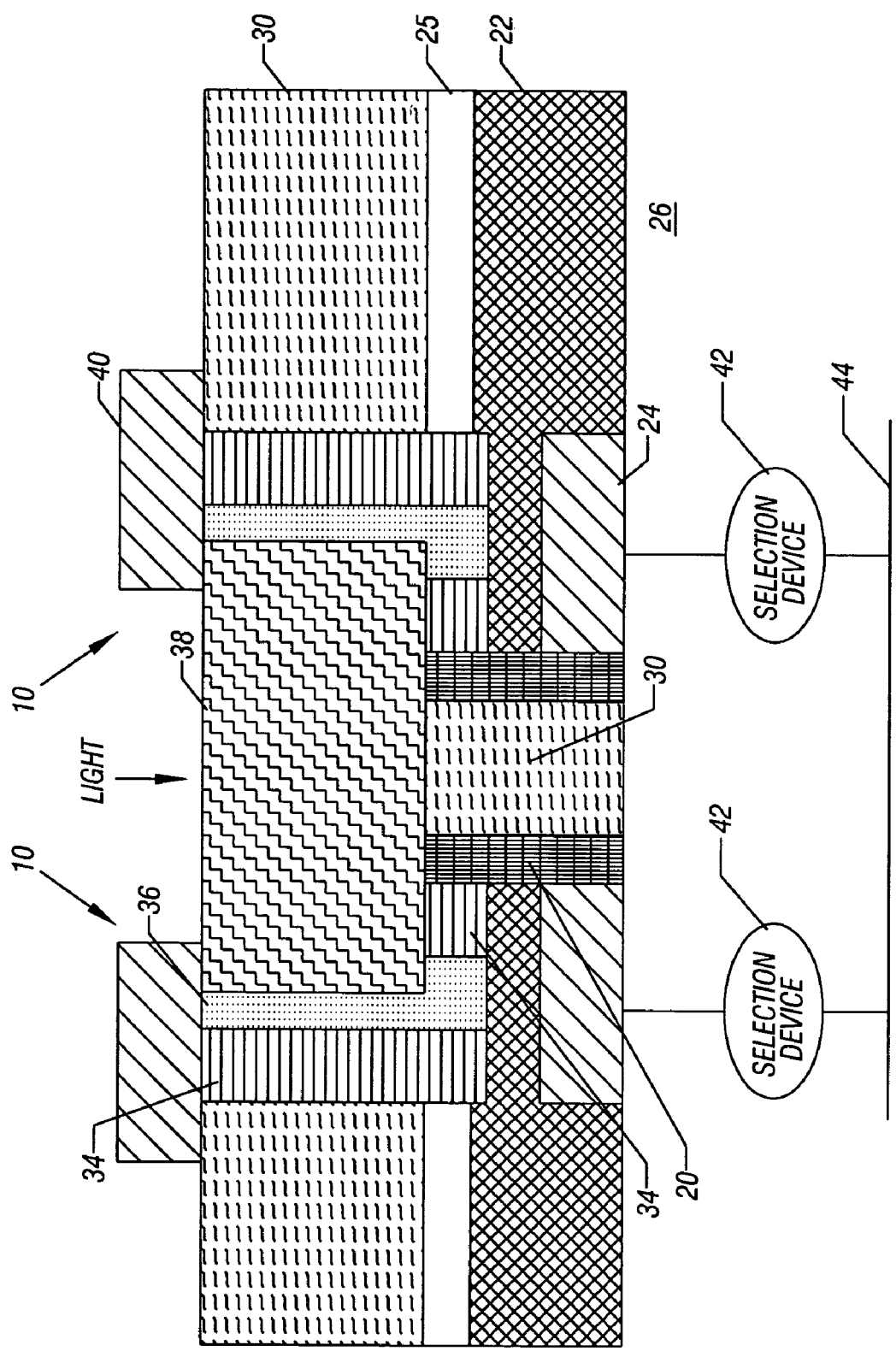
FIG. 1 is a greatly enlarged cross-sectional view of one embodiment of the present invention.

Referring to FIG. 1, a pair of side-by-side cells 10 are formed over a substrate 26, in one embodiment of the present invention. Each cell 10 includes a phase change material 36 between a pair of laterally displaced resistive electrodes 34 on either side of the phase change material 36.

For example, a top electrode 40 may be coupled to a column line and an electrode 34 may be coupled to a row conductive line 44. Of course, the designations "row" and "column" may be reversed and are merely used for convenience.

In one embodiment, the cells 10 may be on the same conductive line 44, each cell 10 selectively coupled to the line 44 by a selection device 42. The selection devices 42 may be, for example, field effect transistors, diodes, or a chalcogenide alloy rich in Selenium as three examples. The selection devices 42 and the conductive line 44 may be formed in a substrate 26 in one embodiment of the present invention.

The selection device 42 may be coupled to a bottom electrode 24. The bottom electrodes 24 of the cells 10 may be separated by an insulator 30. On opposed sides of the insulator 30 is a liner 20. The liner 20 electrically couples the bottom electrode 24 to a resistive electrode 34 associated with each cell 10.

Outbound of each electrode 34 is a phase change material 36 that may extend vertically and may be described as L-shaped in one embodiment. Outbound of the phase change material 36 is an opposed electrode 34. Thus, the phase change cells 10 are arranged laterally so that the electrodes 34 are spaced apart in a horizontal direction, sandwiching intermediate phase change material 36.

The cells 10 may be formed within a dielectric layer 22 and another dielectric layer 30. A light transmissive material 38 such as a dielectric glass or a high bandgap and electrically insulating material 38, such as arsenic sulfide ($As_2S_3$), may also be positioned between the respective cells 10. In some embodiments of the present invention, each cell 10 may be electrically addressed for programming, reading, or writing. In one embodiment, the cells 10 may be optically addressed, two at a time, by a light signal, as indicated, to provide an extra dimension of cell 10 access.

Referring to FIG. 2, a pair of spaced bottom electrodes 24 may be defined over a substrate 26. The bottom electrodes 24 may be formed of aluminum as one example. The bottom electrodes 24 may be shaped or isolated.

A layer 22 of dielectric material may be formed over the substrate 26 on the bottom electrode 24, followed by an etch stop layer 25, followed by an additional layer 22a. A first trench 46 may be formed centrally therethrough. In one embodiment, the layers 22, 22a may be oxide.

Figure 4:
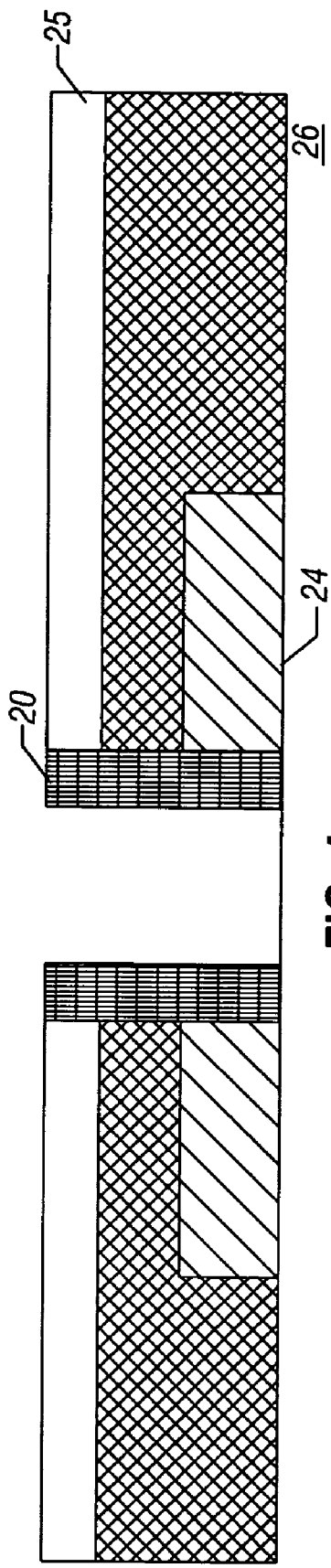
FIG. 4 is a greatly enlarged cross-sectional view at a subsequent stage of manufacture in accordance with one embodiment of the present invention.

As shown in FIG. 3, the conductive liner 20 may be deposited into the first trench 46 and over the layer 22a. In one embodiment, the liner 20 may be tungsten or another strong conductor. As shown in FIG. 4, the portion of the liner 20 at the bottom of the first trench 46, as well as a portion overlying the layer 22a, may be cleared down to the etch stop layer 25, for example, using directional etching techniques.

Figure 5:
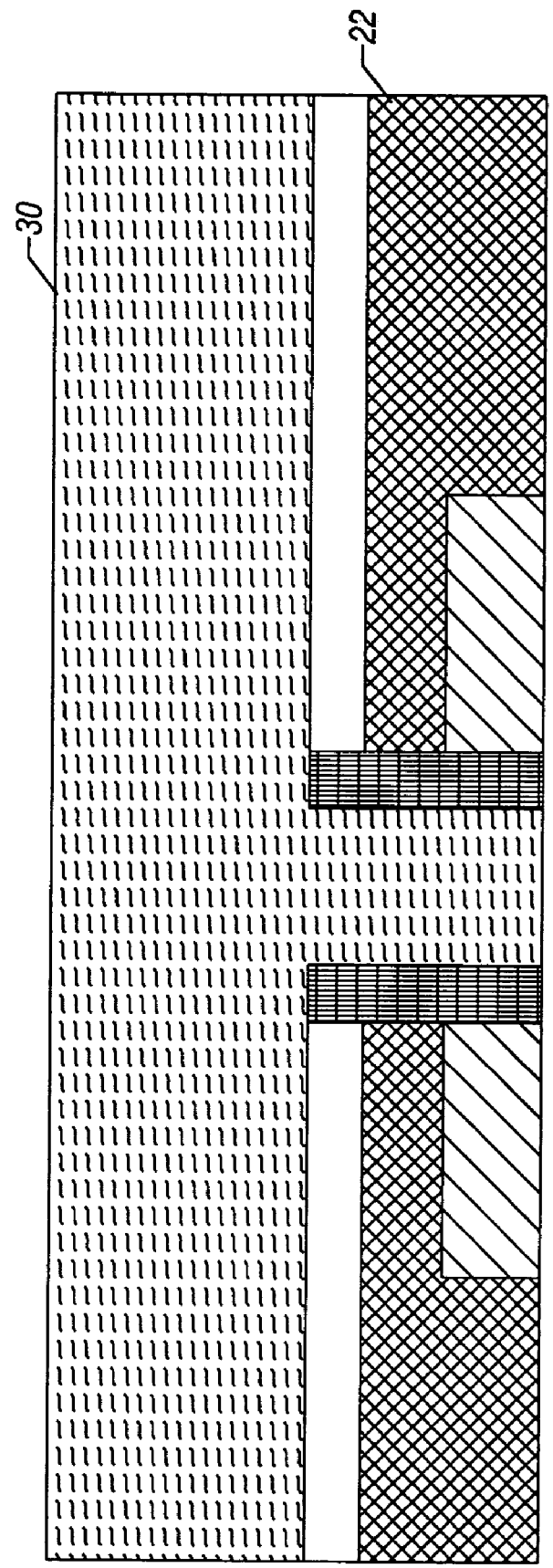
FIG. 5 is a greatly enlarged cross-sectional view at a subsequent stage of manufacture in accordance with one embodiment of the present invention.
Figure 10:
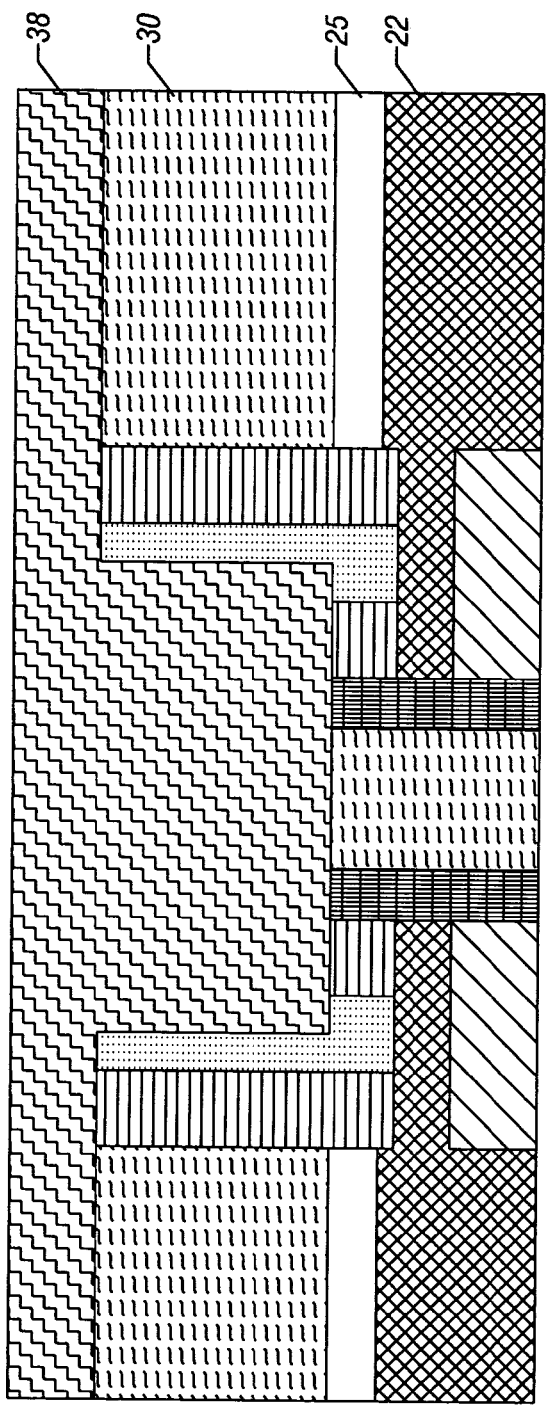
FIG. 10 is a greatly enlarged cross-sectional view at a subsequent stage of manufacture in accordance with one embodiment of the present invention.

Turning next to FIG. 5, the structure of FIG. 4 may be covered by an insulator 30 that may be deposited into the first trench 46 and over the insulator 22. The insulator 30 may be, for example, silicon nitride. The insulator 30 may act as a subsequent chemical mechanical polishing stop in some embodiments.

Next, as shown in FIG. 6, a second trench 38 may be formed using an etchant that does not attack the liner 20 using a mask 32. Then, as shown in FIG. 7, a resistive electrode 34 may be deposited, for example, using chemical vapor deposition. In one embodiment, the resistive electrode 34 may include titanium silicon nitride. As shown in FIG. 8, the resistive electrode 34 may be cleared at the bottom of the second trench 38 and atop of the island 39 and over the mask 32.

Figure 11:
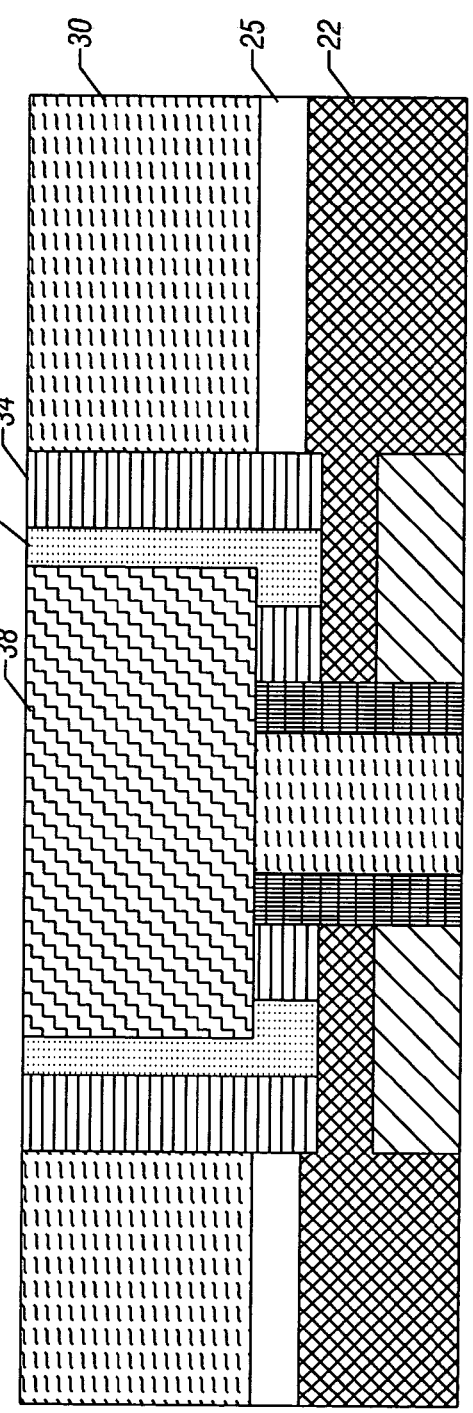
FIG. 11 is a greatly enlarged cross-sectional view at a subsequent stage of manufacture in accordance with one embodiment of the present invention.

Thereafter, the phase change material 36 may be deposited by a chemical vapor deposition process so that a uniform conformal growth occurs on the side of electrode 34. An in situ backsputter may be utilized to remove a central region of that material 36 so that electrical contact between the two cells is broken. An L-shaped phase change material 36 results. Then the remaining structure may be filled with a chalcogenide light transmissive material 38, such as $As_2S_3$, in one embodiment of the present invention. As shown in FIG. 11, this process may be followed by a chemical mechanical polishing that stops on the layer 30. Thereafter, as shown in FIG. 1, the electrodes 40 may be patterned and deposited.

In one embodiment, the phase change material 36 may be a non-volatile, phase change material. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the phase change material 36 may be chalcogenide element composition from the class of tellurium-germanium-antimony ($Te_xGe_ySb_z$) material or a GeSbTe alloy, although the scope of the present invention is not limited to just these materials.

The phase change material 36 may be programmed into one of at least two memory states by applying an electrical signal to the material 36. An electrical signal may alter the phase of the material 36 between a substantially crystalline state and a substantially amorphous state, wherein the electrical resistance of the material 36 in the substantially amorphous state is greater than the resistance of the material 36 in the substantially crystalline state. Accordingly, in this embodiment, the material 36 may be adapted to be altered to one of at least two resistance values within a range of resistance values to provide single bit or multi-bit storage of information.

Programming of the material 36 to alter the state or phase of the material may be accomplished by applying voltage potentials to the lines 40 and 44, thereby generating a voltage potential across the material 36. An electrical current may flow through a portion of the material 36 in response to the applied voltage potentials, and may result in heating of the material 36.

This heating and subsequent cooling may alter the memory state or phase of the material 36. Altering the phase or state of the material 36 may alter an electrical characteristic of the material 36. For example, the resistance of the material 36 may be altered by altering the phase of the material 36. The material 36 may also be referred to as a programmable resistive material or simply a programmable material.

In one embodiment, a voltage potential difference of about 3 volts may be applied across a portion of the material 36 by applying about 3 volts to a lower line 44 and about zero volts to an upper line 40. A current flowing through the material 36 in response to the applied voltage potentials may result in heating of the material. This heating and subsequent cooling may alter the memory state or phase of the material.

In a "reset" state, the material 36 may be in an amorphous or semi-amorphous state and in a "set" state, the material may be in a crystalline or semi-crystalline state. The resistance of the material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the material 36 may be heated to a relatively higher temperature to amorphisize memory material and "reset" memory material (e.g., program memory material to a logic "0" value). Heating the volume of material to a relatively lower crystallization temperature may crystallize memory material and "set" memory material (e.g., program memory material to a logic "1" value). Various resistances of material 36 may be achieved to store information by varying the amount of current flow and duration through the volume of material.

The information stored in material 36 may be read by measuring the resistance of the material 36. As an example, a read current may be provided to the material 36 using opposed lines 40, 44 and a resulting read voltage across the memory material may be compared against a reference voltage using, for example, a sense amplifier (not shown). The read voltage may be proportional to the resistance exhibited by the memory storage element. Thus, a higher voltage may indicate that material is in a relatively higher resistance state, e.g., a "reset" state. A lower voltage may indicate that the material is in a relatively lower resistance state, e.g., a "set" state. A current based system may also be used.

In some embodiments of the present invention, a lateral plate design may have symmetry in all directions leading to an approximately rectangular chalcogenide volume. Thus, such a design may give uniformity to the electric field, current flow, power dissipation and heat flow in some embodiments. Because of the design, the total volume of phase change material 36 may change phase, promoting tight resistance states from one programming event to another, reducing erratic programming, loss of dynamic range, resistance or endurance issues, or possible alloy changes phase during programming event in some embodiments.

Figure 12:
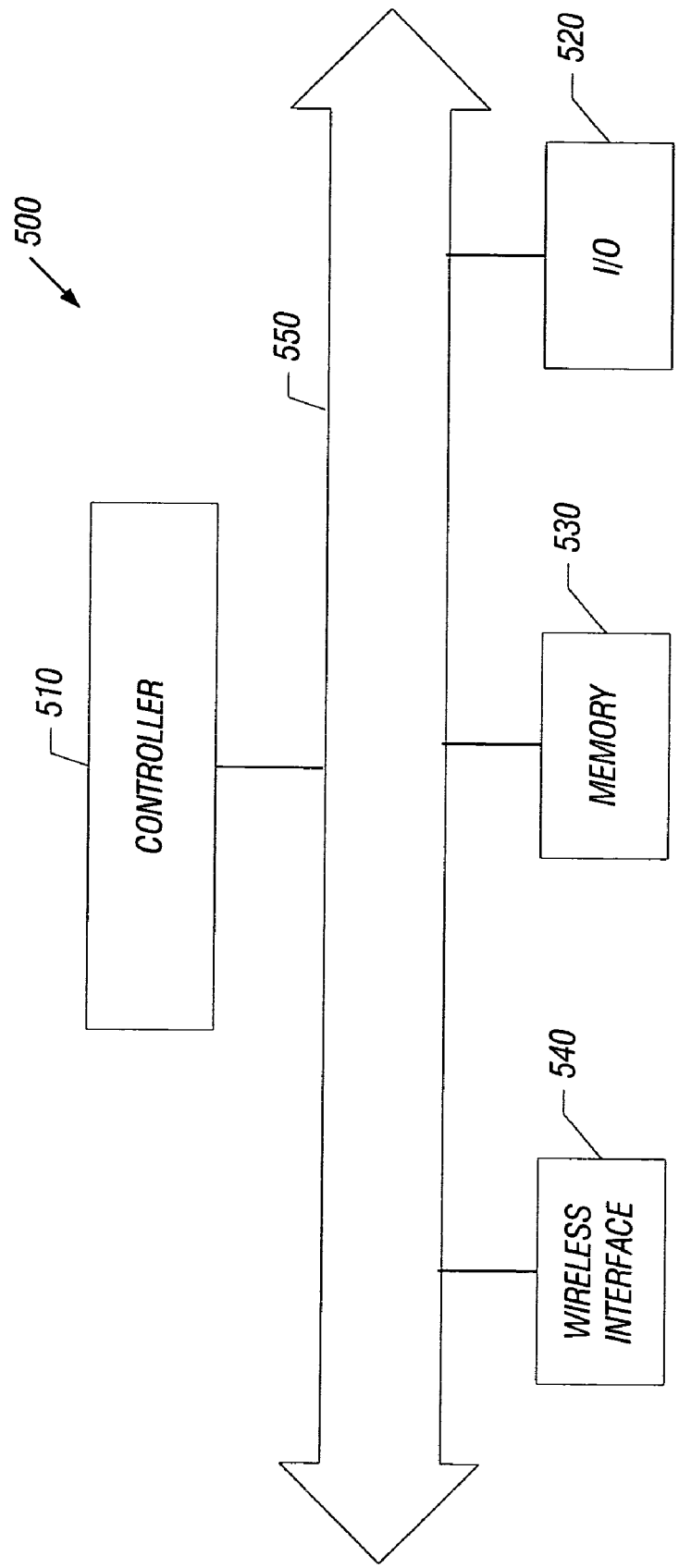
FIG. 12 is a system schematic depiction of one embodiment of the present invention.

Turning to FIG. 12, a portion of a system 500, in accordance with an embodiment of the present invention, may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may, for example, be used in any of the following systems: a wireless local area network (WLAN) system, a wireless personal area network (WPAN) system, or a cellular network, although the scope of the present invention is not limited in this respect.

The system 500 may include a controller 510, an input/output (I/O) device 520 (e.g., a keypad display), a memory 530, and a wireless interface 540 coupled to each other via a bus 550. It should be noted that the scope of the present invention is not limited to embodiments having any or all of these components.

The controller 510 may comprises, for example, one or more microprocessors, digital signal processors, microcontrollers, or the like. The memory 530 may be used to store messages transmitted to or by the system. The memory 530 may also be optionally used to store instructions that are executed by the controller 510. During the operation of the system 500 it may be used to store user data. The memory 530 may be provided by one or more different types of memory. For example, a memory 530 may comprise a volatile memory (any type of random access memory), a non-volatile memory such as a flash memory, and/or phase change memory cells 10.

The I/O device 520 may be utilized to generate a message. The system 500 may use the wireless interface 540 to transmit and receive messages to and from a wireless communication network with a wireless radio frequency (RF) signal. Examples of the wireless interface 540 may include an antenna or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a substantially planar surface; and
   forming a phase change material sandwiched between a pair of horizontally spaced electrodes formed on said substantially planar surface;
   forming two pairs of electrodes for two spaced cells at the same time; and
   depositing a material to form said electrodes in a trench.

2. The method of claim 1 including enabling light to access said phase change material.

3. The method of claim 1 including forming a conductive line in a substrate and forming said material and said electrodes over said substrate.

4. The method of claim 3 including forming a selection device in said substrate.

5. The method of claim 4 including forming a electrical connection from said substrate to a second electrode.

6. The method of claim 5 including electrically coupling said second electrode to one of said horizontally displaced electrodes.

7. The method of claim 1 including covering at least a portion of said phase change material with an optically transmissive material.

8. The method of claim 1 including clearing the bottom of the trench to separate said electrodes and filling the remaining portion of said trench with the phase change material.

9. The method of claim 1 including covering said phase change material with a light transmissive material.

* * * * *